(12) United States Patent
Nataraj et al.

(10) Patent No.: US 7,920,397 B1
(45) Date of Patent: Apr. 5, 2011

(54) MEMORY DEVICE HAVING BIT LINE LEAKAGE COMPENSATION

(75) Inventors: Bindiganavale S. Nataraj, Cupertino, CA (US); Sandeep Khanna, Los Altos, CA (US); Varadarajan Srinivasan, Los Altos Hills, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/771,657

(22) Filed: Apr. 30, 2010

(51) Int. Cl.
*G11C 15/00* (2006.01)

(52) U.S. Cl. .................................. 365/49.1; 365/49.15

(58) Field of Classification Search .................. 365/49.1, 365/49.15
See application file for complete search history.

(56) References Cited

U.S. PATENT DOCUMENTS

| | | |
|---|---|---|
| 4,045,781 A | 8/1977 | Levy et al. |
| 4,523,301 A | 6/1985 | Kadota et al. |
| 5,045,899 A | 9/1991 | Arimoto |
| 5,062,077 A | 10/1991 | Takashima et al. |
| 5,136,543 A | 8/1992 | Matsuda et al. |
| 5,140,556 A | 8/1992 | Cho et al. |
| 5,276,649 A | 1/1994 | Hoshita et al. |
| 5,280,443 A | 1/1994 | Hidaka et al. |
| 5,327,372 A | 7/1994 | Oka et al. |
| 5,383,159 A | 1/1995 | Kubota |
| 5,396,449 A | 3/1995 | Atallah et al. |
| 5,416,734 A | 5/1995 | Hidaka et al. |
| 5,440,715 A | 8/1995 | Wyland |
| 5,446,685 A | 8/1995 | Holst |
| 5,461,589 A | 10/1995 | Hidaka et al. |
| 5,483,480 A | 1/1996 | Yoneda |
| 5,488,583 A | 1/1996 | Ong et al. |
| 5,499,218 A | 3/1996 | Ahn et al. |
| 5,517,441 A | 5/1996 | Dietz et al. |
| 5,534,732 A | 7/1996 | DeBrosse et al. |
| 5,550,769 A | 8/1996 | Hidaka et al. |
| 5,598,115 A | 1/1997 | Holst |
| 5,649,126 A | 7/1997 | Lynch |
| 5,699,288 A | 12/1997 | Kim et al. |
| 5,706,224 A | 1/1998 | Srinivasan et al. |
| 5,740,097 A | 4/1998 | Satoh |
| 5,818,786 A | 10/1998 | Yoneda |
| 5,852,569 A | 12/1998 | Srinivasan et al. |
| 5,859,791 A | 1/1999 | Schultz et al. |
| 5,936,873 A | 8/1999 | Kongetira |
| 5,964,857 A | 10/1999 | Srinivasan et al. |
| 5,966,319 A | 10/1999 | Sato |
| 5,978,246 A | 11/1999 | Shindo |
| 6,044,005 A | 3/2000 | Gibson et al. |
| 6,075,729 A | 6/2000 | Ohhata et al. |
| 6,101,115 A | 8/2000 | Ross |
| 6,101,116 A | 8/2000 | Lien et al. |

(Continued)

*Primary Examiner* — Jason Lappas

(74) *Attorney, Agent, or Firm* — Mahamedi Paradice Kreisman LLP; William L. Paradice, III

(57) ABSTRACT

A memory device operates in a calibration mode during which the effects of bit line leakage current are measured and to operate in a normal mode during which the bit line current is adjusted to compensate for leakage according to the results of the calibration mode. In the calibration mode, a leakage-free sense operation is performed to determine the differential voltage generated on the bit lines in response to a data value. Then, a leakage-susceptible test read operation is performed to determine the differential voltage generated on the bit lines in response to the data value. A detection circuit measures the difference between the differential voltages generated in the leakage-free and leakage-susceptible test read operations to generate a compensation signal, which subsequently adjusts the bit line compensation current during the normal mode.

24 Claims, 11 Drawing Sheets

U.S. PATENT DOCUMENTS

| | | | |
|---|---|---|---|
| 6,125,049 A | 9/2000 | Nataraj | |
| 6,128,207 A | 10/2000 | Lien et al. | |
| 6,147,891 A | 11/2000 | Nataraj | |
| 6,166,939 A | 12/2000 | Nataraj et al. | |
| 6,175,514 B1 | 1/2001 | Henderson et al. | |
| 6,191,969 B1 | 2/2001 | Pereira | |
| 6,191,970 B1 | 2/2001 | Pereira | |
| 6,195,278 B1 | 2/2001 | Calin et al. | |
| 6,240,001 B1 | 5/2001 | Ross | |
| 6,243,280 B1 | 6/2001 | Wong et al. | |
| 6,243,281 B1 | 6/2001 | Pereira | |
| 6,246,601 B1 | 6/2001 | Pereira | |
| 6,252,789 B1 | 6/2001 | Pereira et al. | |
| 6,256,216 B1 | 7/2001 | Lien et al. | |
| 6,256,241 B1 | 7/2001 | Mehalel | |
| 6,262,907 B1 | 7/2001 | Lien et al. | |
| 6,262,929 B1 | 7/2001 | Miyatake et al. | |
| 6,282,113 B1 | 8/2001 | DeBrosse | |
| 6,292,383 B1 | 9/2001 | Worley | |
| 6,324,087 B1 | 11/2001 | Pereira | |
| 6,331,942 B1 | 12/2001 | Peterson | |
| 6,341,079 B1 | 1/2002 | Chadwick | |
| 6,343,029 B1 | 1/2002 | Kengeri et al. | |
| 6,349,049 B1 | 2/2002 | Schoy | |
| 6,362,993 B1 | 3/2002 | Henderson et al. | |
| 6,370,613 B1 | 4/2002 | Diede et al. | |
| 6,373,738 B1 | 4/2002 | Towler et al. | |
| 6,430,074 B1 | 8/2002 | Srinivasan | |
| 6,442,061 B1 | 8/2002 | Kong et al. | |
| 6,452,822 B1 | 9/2002 | Chai et al. | |
| 6,483,733 B2 | 11/2002 | Lines et al. | |
| 6,499,081 B1 | 12/2002 | Nataraj et al. | |
| 6,500,706 B1 | 12/2002 | Chi | |
| 6,512,682 B2 | 1/2003 | Cohen et al. | |
| 6,560,670 B1 | 5/2003 | Ichiriu | |
| 6,563,727 B1 | 5/2003 | Roth et al. | |
| 6,570,794 B1 | 5/2003 | Hokenmaier et al. | |
| 6,597,594 B2 | 7/2003 | Waller | |
| 6,597,596 B2 | 7/2003 | Gordon et al. | |
| 6,646,900 B2 | 11/2003 | Tsuda et al. | |
| 6,657,880 B1 | 12/2003 | Callahan | |
| 6,697,277 B2 | 2/2004 | Towler et al. | |
| 6,708,250 B2 | 3/2004 | Gillingham | |
| 6,760,241 B1 * | 7/2004 | Gharia | 365/49.15 |
| 6,785,179 B1 | 8/2004 | Bull et al. | |
| 6,795,325 B1 | 9/2004 | Inoue | |
| 6,803,610 B2 | 10/2004 | Koolhaas et al. | |
| 6,804,134 B1 | 10/2004 | Proebsting et al. | |
| 6,807,077 B2 | 10/2004 | Noda et al. | |
| 6,879,504 B1 | 4/2005 | Lien et al. | |
| 6,888,730 B2 | 5/2005 | Foss et al. | |
| 6,900,999 B1 | 5/2005 | Yen et al. | |
| 6,901,000 B1 | 5/2005 | Ichiriu et al. | |
| 6,906,937 B1 | 6/2005 | Nataraj | |
| 7,154,764 B2 | 12/2006 | Nataraj | |
| 7,319,602 B1 | 1/2008 | Srinivasan et al. | |
| 7,355,890 B1 | 4/2008 | Wen | |
| 7,545,661 B2 | 6/2009 | Srinivasan et al. | |
| 2003/0002351 A1 | 1/2003 | Beer et al. | |
| 2003/0070039 A1 | 4/2003 | Gillingham | |
| 2003/0123269 A1 | 7/2003 | Gillingham et al. | |
| 2010/0271854 A1 | 10/2010 | Chu | |

* cited by examiner ured bit line current of the memory device accurately reflects the actual bit line leakage conditions, which in turn allows for more efficient leakage compensation than prior techniques.

MEMORY DEVICE HAVING BIT LINE LEAKAGE COMPENSATION

TECHNICAL FIELD

The present invention relates generally to memory architectures, and more specifically to memory architectures having bit line leakage compensation.

DESCRIPTION OF RELATED ART

As semiconductor manufacturing geometries decrease, the effects of undesirable leakage currents in metal oxide semiconductor (MOS) devices become greater. Ideally, an MOS transistor should not conduct any current when turned off (e.g., when the transistor's gate to source voltage $V_{GS}$ is less than the threshold voltage $V_T$). In practice, however, MOS transistors typically conduct a leakage current when in the off state. This undesirable sub-threshold leakage current can adversely affect performance of semiconductor devices. For example, leakage currents on the bit lines of semiconductor memory devices during read operations not only increase power consumption but also slow read speeds, and can even lead to erroneous data reads.

FIG. 1 illustrates a typical static random access memory (SRAM) cell 100 and bit line leakage paths therein. SRAM cell 100 includes two PMOS transistors 111-112 and four NMOS transistors 113-116. PMOS transistor 111 and NMOS transistor 113 are connected in series between a supply voltage $V_{DD}$ and ground potential to form a first inverter having an input at node 102, and PMOS transistor 112 and NMOS transistor 114 are connected in series between $V_{DD}$ and ground potential to form a second inverter having an input at node 101. Together, the cross-coupled inverters formed by PMOS transistors 111-112 and NMOS transistors 113-114 form a latch 110 that stores a data bit D at node 101 and stores a complemented data bit $\overline{D}$ at node 102. NMOS transistor 115 is coupled between a bit line BL and node 101, and has a gate coupled to a word line WL. NMOS transistor 116 is coupled between a complementary bit line $\overline{BL}$ and node 102, and has a gate coupled to WL.

Data is written to SRAM cell 100 by applying a data value on complementary bit lines BL/$\overline{BL}$ and activating the word line WL. For example, to store a binary data value "1" in SRAM cell 100, the word line WL is driven high towards $V_{DD}$ to turn on access transistors 115-116, and the data value D=1 is applied to SRAM cell 100 by driving the bit line BL high towards $V_{DD}$ and driving the complementary bit line $\overline{BL}$ low towards ground potential, thereby driving node 101 high towards $V_{DD}$ and driving node 102 low towards ground potential. The resulting logic high state at node 101 turns on NMOS transistor 114 to maintain node 102 in the logic low state, and the resulting logic low state at node 102 turns on PMOS transistor 111 to maintain node 101 in the logic high state. Conversely, to store a binary data value "0" in SRAM cell 100, the word line WL is driven high towards $V_{DD}$ to turn on access transistors 115-116, and the data value D=0 is applied to SRAM cell 100 by driving the bit line BL low towards ground potential and driving the complementary bit line $\overline{BL}$ high towards $V_{DD}$, thereby driving node 101 low towards ground potential and driving node 102 high towards $V_{DD}$. The resulting logic low state at node 101 turns on PMOS transistor 112 to maintain node 102 in the logic high state, and the resulting logic high state at node 102 turns on NMOS transistor 113 to maintain node 101 in the logic low state.

To read data stored in SRAM cell 100, the bit lines BL and $\overline{BL}$ are pre-charged high towards $V_{DD}$ by corresponding pre-charge transistors 121-122 in response to assertion of a pre-charge signal PC. Then, the word line WL is driven high towards $V_{DD}$ to turn on access transistors 115 and 116, which couple nodes 101 and 102 to BL and $\overline{BL}$, respectively, and allow the data stored in SRAM cell 100 to be represented as a differential voltage between BL and $\overline{BL}$. This differential voltage is then measured by a sense amplifier (not shown for simplicity) to ascertain the value of the data stored in cell 100. For example, if D=1, the logic high state of node 101 turns on NMOS transistor 114 which pulls $\overline{BL}$ low towards ground potential, and the logic low state of node 102 turns on PMOS transistor 111 to maintain BL in its logic high state. Conversely, if D=0, the logic high state of node 102 turns on NMOS transistor 113 which pulls BL low towards ground potential, and the logic low state of node 101 turns on PMOS transistor 112 to maintain $\overline{BL}$ in its logic high state.

During read operations, a leakage current exists in SRAM cell 100 that undesirably reduces the differential voltage between BL and $\overline{BL}$, regardless of the value of D. For example, when D=1 and $\overline{D}$=0, a small leakage current 104 flows from $\overline{BL}$ to ground potential through transistors 116 and 114 and undesirably pulls down the voltage of the complementary bit line $\overline{BL}$. Similarly, when D=0 and $\overline{D}$=1, a small leakage current 103 flows from BL to ground potential through transistors 115 and 113 and undesirably pulls down the voltage of the bit line BL. If enough leakage current is introduced (e.g., by other SRAM cells coupled to bit lines BL and $\overline{BL}$), the differential voltage on BL and $\overline{BL}$ may become too small to reliably read the data stored in the SRAM cell 100.

FIG. 1B is an exemplary graph 200 illustrating the adverse effect that bit line leakage currents can have on the differential voltage between BL and $\overline{BL}$ during read operations, where line 210 depicts the differential voltage between BL and $\overline{BL}$ without the effects of leakage current, and line 220 depicts the differential voltage between BL and $\overline{BL}$ with the effects of leakage current. During read operations, the bit line pre-charge signal PC is asserted to logic high to charge BL and $\overline{BL}$ high towards $V_{DD}$. At time $t_1$, PC is de-asserted to turn off pre-charge transistors 121-122, and at time $t_2$ the word line WL is asserted to logic high to turn on access transistors 115-116. Thereafter, a differential voltage develops on BL and $\overline{BL}$, which is sensed by the sense amplifier at time $t_3$. As illustrated in FIG. 2, the bit line split 211 on BL and $\overline{BL}$ without leakage current is much greater than the bit line split 221 on BL and $\overline{BL}$ with leakage current.

Several techniques have been used to mitigate the effects of leakage current upon SRAM operations. One approach is to increase the threshold voltage of the transistors in the memory device to reduce the leakage current. However, increasing the transistor threshold voltage undesirably reduces the speed of the memory device, and is not always effective due to the dependence of threshold voltages on process technologies. Another approach is to increase the bit line current during read pre-charge operations to offset the leakage current. The increase in bit line pre-charge current is typically predetermined using a worst-case leakage current scenario and then applied to all device of the same type (e.g., to a plurality of SRAM devices constructed from the same and/or different wafers). However, due to process variations inherent in the manufacture of semiconductor devices, leakage current is not uniform across silicon wafers or even across the columns of a single memory array. Therefore, indiscriminately increasing the bit line pre-charge current by a uniform amount may under-compensate for some wafers and/or portions thereof while over-compensating for other wafers and/or portions thereof.

A technique to adjust the bit line current in individual columns of a memory array is disclosed in a publication entitled "A Bit line Leakage Compensation Scheme for Low-Voltage SRAMs" by Agawa et al, incorporated herein by reference. That technique measures each bit line's leakage current during the pre-charge cycle of the read operation and then injects a corresponding amount of current to the bit line during the sensing phase of the read operation. Although effective in individually adjusting the current of each bit line, Agawa's technique undesirably limits read speeds because of the time needed to measure the leakage current during the pre-charge phase of each read operation.

Thus, there is a need to compensate for leakage currents in memory devices that employ SRAM cells that does not adversely affect read speeds.

BRIEF DESCRIPTION OF THE DRAWINGS

The features and advantages of the present disclosure are illustrated by way of example, and not by way of limitation, in the figures of the accompanying drawings as follows.

Like reference numerals refer to corresponding parts throughout the drawing figures.

DETAILED DESCRIPTION

Figure 1A:
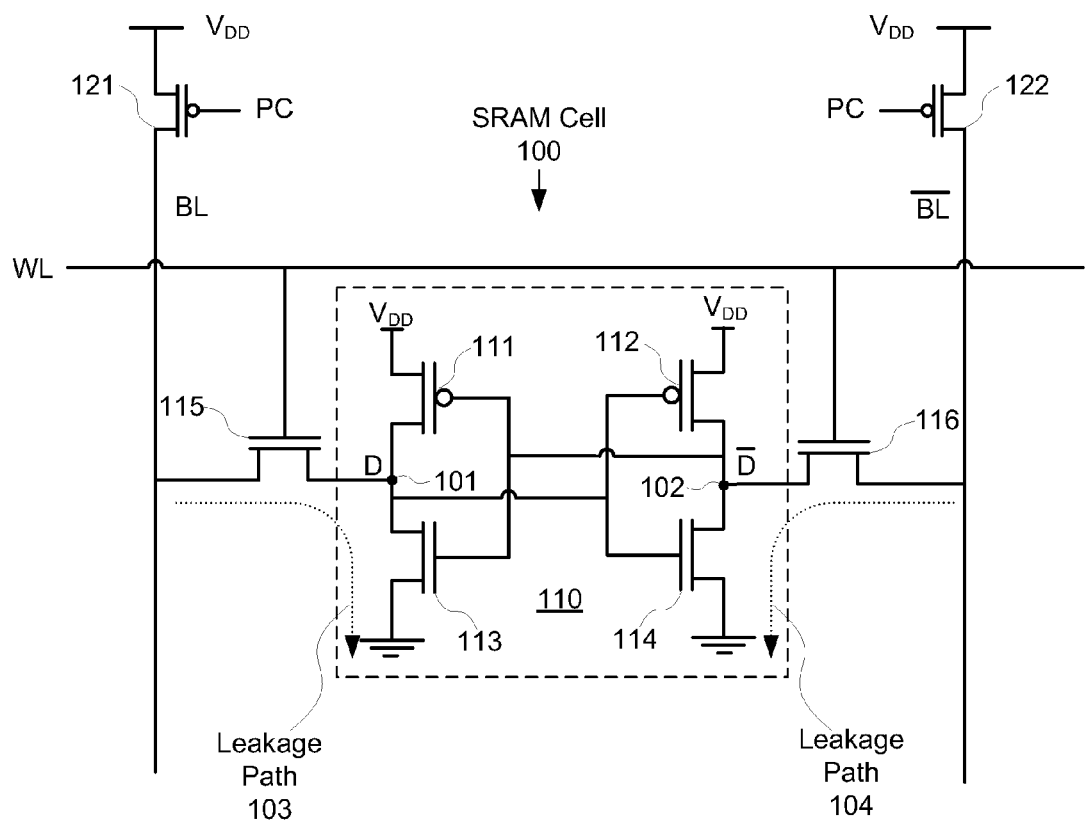
FIG. 1A shows a conventional SRAM cell and leakage current paths therein.
Figure 1B:
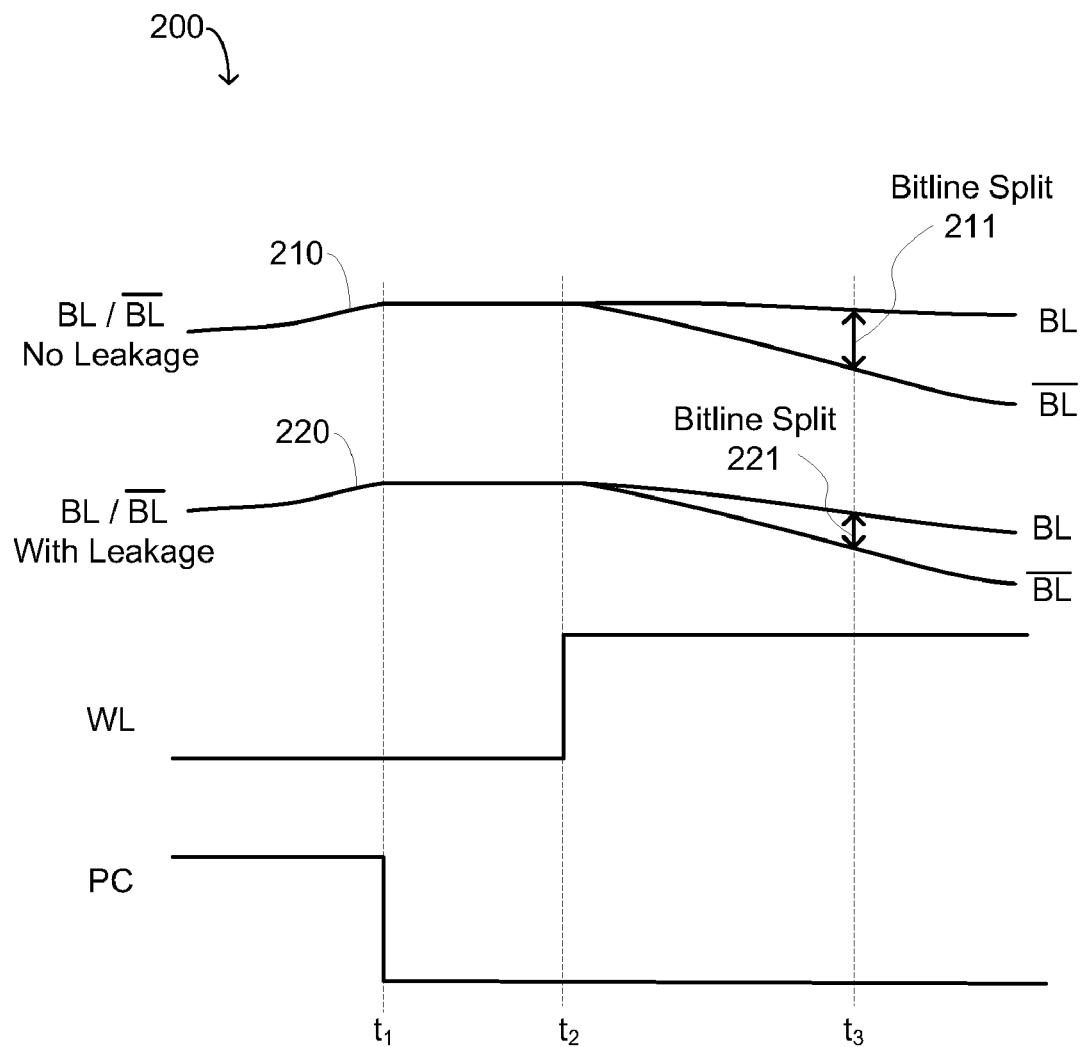
FIG. 1B illustrates the effect of leakage current upon the differential voltage on complementary bit lines during read operations in the SRAM cell of FIG. 1A.

A method and apparatus of compensating for bit line leakage currents in devices containing SRAM cells are described below in the context of a exemplary CAM device for simplicity only. It is to be understood that embodiments of the present invention may be used in any device that employs SRAM cells or latches, including SRAM devices and/or other types of CAM devices. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses.

Further, the logic states of various signals described herein are exemplary and therefore may be reversed or otherwise modified as generally known in the art. As another example, circuits described or depicted as including metal oxide semiconductor (MOS) transistors may alternatively be implemented using bipolar transistors or any other technology in which a signal-controlled current flow may be achieved. Also, signals referred to herein as clock signals may alternatively be strobe signals or any other signals that provide timing control. Furthermore, dynamic or domino logic circuits described herein, where transistors driven by clock signals are used to pre-charge outputs of the circuits, may be alternatively implemented as static complementary MOS (CMOS) circuits.

Present embodiments reduce the effects of undesirable leakage currents in memory devices that contain SRAM cells without sacrificing read speeds. Memory devices in accordance with present embodiments are configured to operate in a calibration mode during which the effects of bit line leakage current are measured and to operate in a normal mode during which the bit line current is adjusted to compensate for leakage according to the results of the calibration mode. For some embodiments, when the memory device is selected to operate in the calibration mode, a leakage-free sense operation is performed to determine the differential voltage generated on the bit lines in response to a given stored data value. Then, a leakage-susceptible test read operation is performed to determine the differential voltage generated on the bit lines in response to the given stored data value. A leakage detection circuit measures the difference between the differential voltages generated in the leakage-free and leakage-susceptible test read operations and generates a compensation signal. In response to the compensation signal, a bit line compensation circuit selectively adjusts the current provided to the bit lines during the test read operation. This process may be repeated any number of iterations until a value of the compensation signal that results in an amount of bit line compensation current sufficient to compensate for leakage is determined. This final value of the compensation signal is then stored in a suitable compensation memory.

When the memory device is selected to operate in the normal mode, the leakage detection circuit is disabled, and the compensation signal is read from the compensation memory and provided to the bit line compensation circuit. In response to the bit line compensation signal, the bit line compensation circuit provides the corresponding amount of compensation current to the bit lines for read operations performed during the normal mode. As used herein, the term "normal" mode refers to the operational mode in which read, write, compare, and other operations are performed when the device is employed and operated in an application or system.

By selectively determining the amount of bit line current needed to compensate for leakage in an iterative process performed during the calibration mode, present embodiments are advantageous over the various prior art techniques mentioned above. For example, the iterative process by which the bit line current is incrementally increased until the leakage associated with the corresponding device is specifically compensated allows for more precise bit line leakage compensation than indiscriminately injecting a predetermined amount of current into the bit line. Further, determining the amount of bit line compensation current during the calibration mode (e.g., rather than during actual read operations) allows read speeds to be independent of measuring the leakage current, thereby allowing for maximum read speeds.

For some embodiments, each column of the memory device includes its own leakage detection circuit that generates a separate compensation signal for the column's bit line compensation circuit. For these embodiments, multiple columns of memory cells can share the same leakage detection circuit. For other embodiments, each block of N columns of the memory device includes its own leakage detection circuit that generates a separate compensation signal for the bit line compensation circuits associated with the block's columns. For these embodiments, leakage can be addressed on a per-block basis, thereby reducing the overhead of the leakage detection circuitry while still allowing for the leakage in different portions of the memory array to be independently compensated.

Figure 2A:
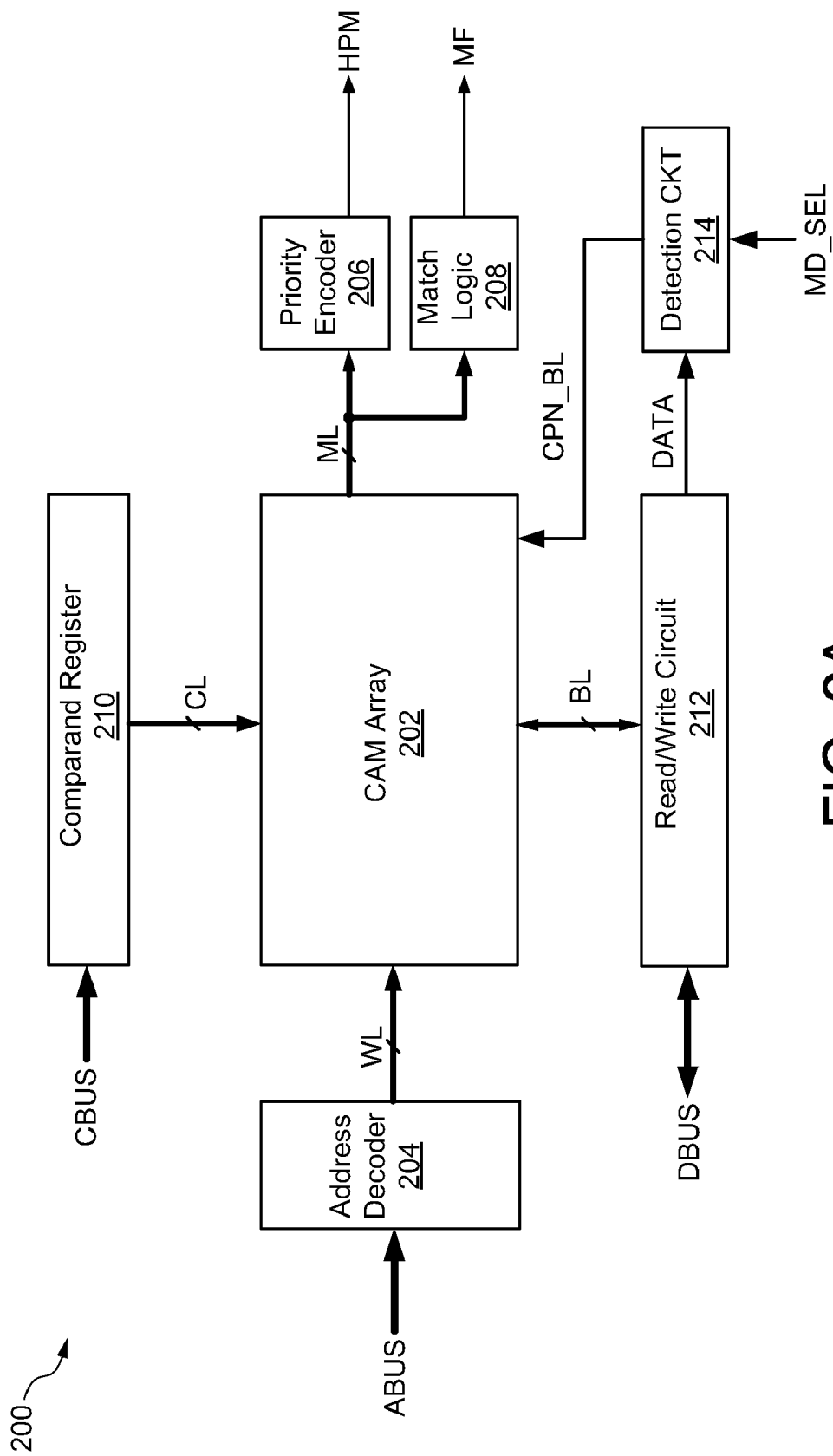
FIG. 2A shows a content addressable memory (CAM) device within which present embodiments may be implemented.

FIG. 2A shows an exemplary CAM device 200 within which present embodiments may be implemented. CAM device 200 includes a CAM array 202 that has a plurality of CAM cells (not shown in FIG. 2A for simplicity) arranged in any number of rows and columns. The CAM cells in array 202 may be any suitable type of CAM cell including, for example, binary, ternary, and/or quaternary CAM cells. One or more instructions and related control signals may be provided to CAM device 200 from an instruction decoder (not shown for simplicity) to control read, write, compare, and/or test operations for CAM device 200. Other well-known signals which may be provided to CAM device 200, such as enable signals, reset signals, and clock signals, are not shown for simplicity.

Each row of CAM cells in array 202 is coupled to an address decoder 204 via a corresponding word line WL, and to a priority encoder 206 and to match logic 208 via a corresponding match line ML. The word lines and match lines are represented collectively in FIG. 2A for simplicity. For one embodiment, address decoder 204 receives addresses from an address bus ABUS. For other embodiments, address decoder 204 receives addresses from another bus. The match lines ML provide match results for compare operations to priority encoder 206, which determines the matching entry that has the highest priority number associated with it and generates the index or address of this highest priority match (HPM). Match logic 208 may generate a match flag to indicate a match condition, and may also generate a multiple match flag to indicate multiple matches.

Further, although not shown in FIG. 2A for simplicity, each row of CAM cells in array 202 may have one or more validity bits to indicate whether the corresponding row (or segment thereof) of CAM cells is in a valid state or an empty state. The validity bits may be provided to priority encoder 206 to generate the next free address (NFA) that is available in CAM array 202 for storing new data. The validity bits may also be provided to a well-known full flag logic circuit (not shown for simplicity) to generate a full flag and/or empty flag for CAM array 202.

Each column of CAM cells in array 202 is coupled to a comparand register 210 via comparand lines CL and to a read/write circuit 212 via bit lines BL. Comparand register 210 provides a comparand word (e.g., search key) received from a comparand bus CBUS to CAM array 202 for comparison with entries stored in CAM array 202. For other embodiments, comparand words may be provided to comparand register 210 from another bus. Read/write circuit 212 includes well-known write drivers and sense amplifiers, and is coupled to a data bus DBUS. Although not shown for simplicity, CAM device 200 may also include a global mask circuit that stores one or more mask patterns that mask entries in CAM array 202 during compare operations with the comparand word provided by comparand register 210.

CAM device 200 also includes a leakage detection circuit 214 having a first input to receive a mode select signal MD_SEL, a second input to receive data from the read/write circuit 212, and an output to provide a bit line compensation signal CPN_BL to CAM array 202. The mode select signal MD_SEL determines whether CAM device 200 operates in the calibration mode or operates in the normal mode. For some embodiments, MD_SEL can be generated by a user. For other embodiments, MD_SEL can be generated by a device manufacturer. For still other embodiments, the calibration process can be performed prior to delivery of CAM device 200 to the user, and MD_SEL can be eliminated. As described in more detail below, during the calibration mode, leakage detection circuit 214 compares the differential voltages generated during leakage-free test read operations and leakage-susceptible test read operations, and in response to the comparison generates CPN_BL. Then, bit line compensation circuitry (not shown in FIG. 2A for simplicity) within or associated with CAM array 202 adjusts the bit line current provided for test read operations. For some embodiments, detection circuit 214 includes a compensation memory (not shown in FIG. 2A for simplicity) to store the final value of CPN_BL. Thereafter, during normal operation, detection circuit 214 is disabled, and CPN_BL is provided to CAM array 202 to selectively adjust the bit line current for read operations in a manner that compensates for leakage currents while maximizing read speeds. For other embodiments, CPN_BL can be stored in a suitable memory within or associated with CAM array 202.

Figure 2B:
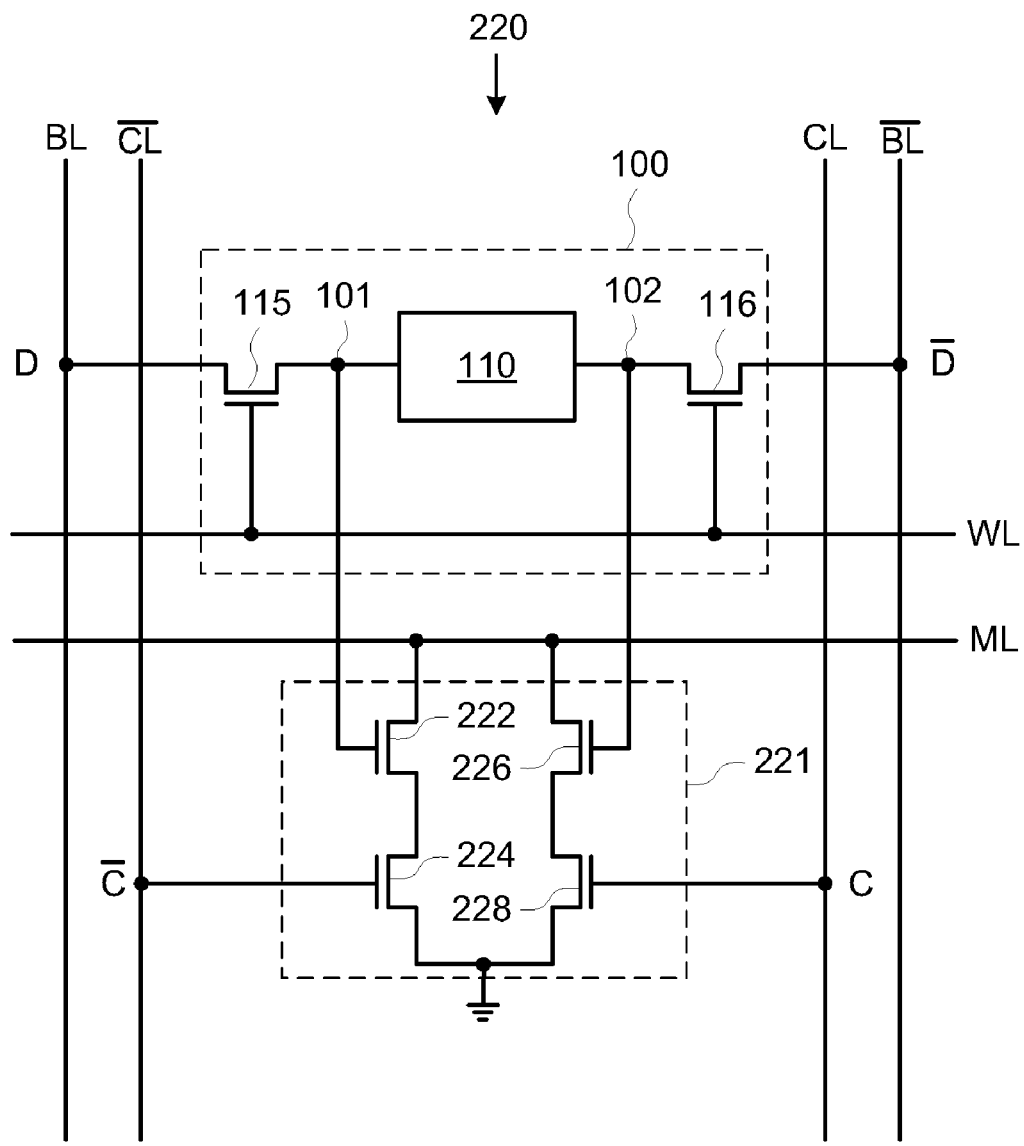
FIG. 2B shows a CAM cell employed in the CAM array of FIG. 2A.

FIG. 2B shows a binary CAM cell 220 that may be employed in the CAM array of FIG. 2A. CAM cell 220, which compares a data bit D with a comparand bit C, includes the SRAM cell 110 of FIG. 1A and a compare circuit 221. Compare circuit 221 includes NMOS transistors 222, 224, 226, and 228. Transistors 222 and 224 are coupled in series between a match line ML and ground potential, with the gate of transistor 222 receiving the data bit D from node 101 and the gate of transistor 224 receiving a complement $\overline{C}$ of the comparand bit from a complementary comparand line $\overline{CL}$. Transistors 226 and 228 are coupled in series between match line ML and ground potential, with the gate of transistor 226 receiving the complement $\overline{D}$ of the data bit from node 102 and the gate of transistor 228 receiving the comparand bit C from the comparand line CL. Read, write, compare, and other operations of CAM array 202 are well-known in the art, and thus are not described herein.

For other embodiments, other suitable storage elements may be used for memory cell 110, and other suitable compare circuits may be used for compare circuit 221. For other embodiments, comparand line pair CL and $\overline{CL}$ may be eliminated, and bit line pair BL and $\overline{BL}$ may provide comparand data to CAM cells 220, as is commonly known in the art.

Figure 3A:
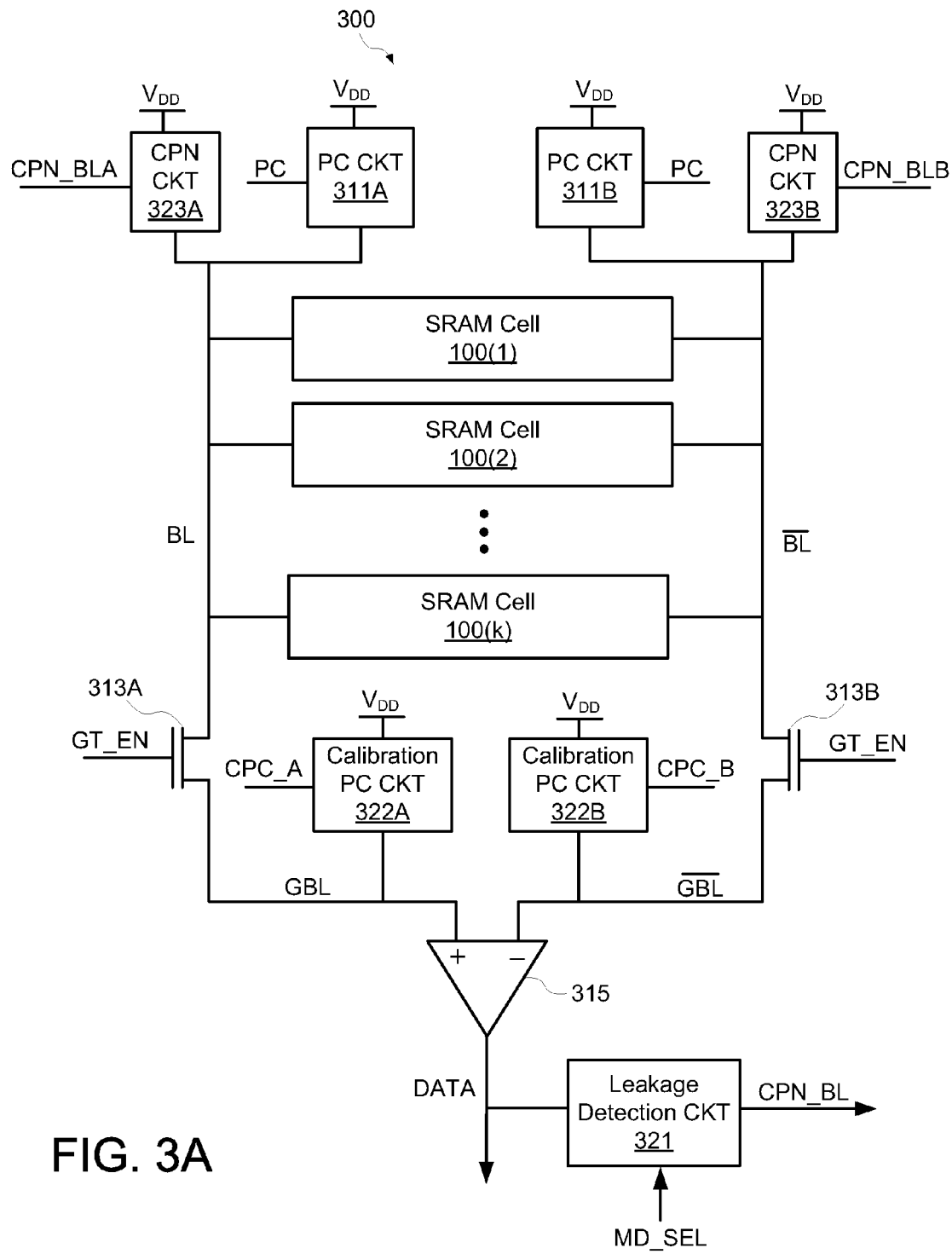
FIG. 3A shows a column of the CAM array of FIG. 2A in accordance with some embodiments.

FIG. 3A illustrates a column 300 of CAM array 202 in accordance with some embodiments. Column 300 includes a plurality of SRAM cells 100(1)-100(k), pre-charge circuits 311A and 311B, NMOS bit line gating transistors 313A and 313B, a sense amplifier 315, a leakage detection circuit 321, calibration pre-charge circuits 322A and 322B, and bit line compensation circuits 323A and 323B. SRAM cells 100(1)-100(k) are each coupled to bit lines BL and $\overline{BL}$. For the exemplary embodiment of FIG. 3A, only the SRAM cell portion of the CAM cells are shown, and the comparand lines are omitted. For actual embodiments, column 300 can include corresponding compare circuits 221 and comparand line pairs CL/$\overline{CL}$, as shown in FIG. 2B. For other embodiments, column 300 can be a column of SRAM cells in an SRAM array.

The pre-charge circuits 311A and 311B are coupled between supply voltage $V_{DD}$ and bit lines BL and $\overline{BL}$, respectively, and each have a control terminal to receive a bit line pre-charge signal PC. When PC is asserted, pre-charge circuits 311A and 311B pre-charge respective bit lines BL and $\overline{BL}$ high towards $V_{DD}$. For some embodiments, pre-charge circuits 311A and 311B are PMOS transistors, although other suitable circuitry can be used for other embodiments. Bit line gating transistor 313A is coupled between the bit line BL and a first input of sense amplifier 315 via a gated bit line GBL, and has a gate to receive a gating transistor enable signal GT_EN. Bit line gating transistor 313B is coupled between the complementary bit line $\overline{BL}$ and a second input of sense amplifier 315 via a complementary gated bit line $\overline{GBL}$, and has a gate to receive GT_EN. When GT_EN is de-asserted to logic low, gating transistors 313A and 313B de-couple BL and $\overline{BL}$ from sense amplifier 315. When GT_EN is asserted to logic high, gating transistors 313A and 313B couple BL and $\overline{BL}$ to sense amplifier 315. Sense amplifier 315, which can be any well-known sensing circuit, has an output to generate a data signal DATA in response to a differential voltage between its inputs.

Calibration pre-charge circuits 322A and 322B are coupled between $V_{DD}$ and GBL and $\overline{GBL}$, respectively. Calibration pre-charge circuit 322A has a control terminal to receive a first compensation pre-charge signal CPC_A, and calibration pre-charge circuit 322B has a control terminal to receive a second compensation pre-charge signal CPC_B. Calibration pre-charge circuits 322A and 322B selectively pre-charge lines GBL and $\overline{GBL}$ high towards $V_{DD}$ in response to CPC_A and CPC_B, respectively. For some embodiments, calibration pre-charge circuits 322A and 322B are PMOS transistors, although other suitable circuitry can be used for other embodiments.

Leakage detection circuit 321 has a first input to receive DATA from sense amplifier 315, a second input to receive the mode select signal MD_SEL, and an output to generate the bit line compensation signal CPN_BL. The bit line compensation circuits 323A and 323B are coupled between $V_{DD}$ and BL and $\overline{BL}$, respectively, and have control terminals to receive first and second bit line compensation signals CPN_BLA and CPN_BLB, respectively. Bit line compensation circuits 323A and 323B selectively adjust the amount of bit line current provided during read operations in response to CPN_BLA and CPN_BLB, respectively, as described in detail below.

As mentioned above, present embodiments are configured to operate in a calibration mode during which the effects of bit line leakage current are measured and to operate in a normal mode during which the bit line current is adjusted to compensate for leakage according to the leakage results determined during the calibration mode. For the exemplary embodiment of FIG. 3A, column 300 enters the calibration mode when MD_SEL is asserted to a first state, which enables leakage detection circuit 321. For some embodiments, the first state of MD_SEL can be used to disable comparand register 210, priority encoder 206, and/or match logic 208 (see also FIG. 2A).

Once the memory device is in the calibration mode, a leakage-free sense operation is performed. The signal GT_EN is de-asserted to logic low, which turns off gating transistors 313A and 313B to de-couple the bit lines BL and $\overline{BL}$ from sense amplifier 315. Then, the signal CPC_A is asserted to logic high to turn on the calibration pre-charge circuit 322A, which pre-charges the gated bit line GBL high towards $V_{DD}$, and the signal CPC_B is de-asserted to logic low to turn off the calibration pre-charge circuit 322B, thereby maintaining $\overline{GBL}$ in a logic low state. The resulting differential voltage between GBL and $\overline{GBL}$, which corresponds to D=1, is measured by the sense amplifier 315 to generate a data signal indicative of the data value D=1. This data value is hereinafter referred to as the reference data value DATA_REF because it corresponds to the leakage-free sense operation, to which the results of subsequent test read operations are referenced (e.g., compared). The value DATA_REF is stored in a suitable memory element (not shown for simplicity) provided within or associated with leakage detection circuit 321. For some embodiments, DATA_REF is a digital value. For other embodiments, DATA_REF is an analog value. Because the gated bit lines GBL and $\overline{GBL}$ are not coupled to any of the SRAM cells 100, this sense operation is designated as leakage free.

Next, a leakage-susceptible test read operation is performed. The signal GT_EN is asserted to logic high, which turns on gating transistors 313A and 313B to couple the bit lines BL and $\overline{BL}$ to sense amplifier 315. Signals CPC_A and CPC_B are de-asserted to logic low to turn off the calibration pre-charge circuits 322A and 322B, thereby isolating GBL and $\overline{GBL}$ from $V_{DD}$. Pre-charge signal PC is asserted to turn on pre-charge circuits 311A and 311B, which in turn pre-charge BL and $\overline{BL}$ high towards $V_{DD}$. An SRAM cell 100 storing a logic high data bit D=1 is selected for the test read operation by asserting its corresponding word line (not shown for simplicity). Referring also to FIG. 1A, the D=1 value at node 101 of the selected SRAM cell 100 in column 300 turns on NMOS pull-down transistor 114, which discharges $\overline{BL}$ low towards ground potential, and the $\overline{D}$=0 value of node 102 turns on PMOS pull-up transistor 111 to maintain BL in its pre-charged logic high state. The resulting differential voltage between BL and $\overline{BL}$ is measured by the sense amplifier 315 to generate the signal DATA indicative of the stored data value D=1. This data value is hereinafter referred to as the first leakage data value DATA_LK1 because it corresponds to the first leakage-susceptible test read operation. The value of DATA_LK1 is stored in a suitable memory element (not shown for simplicity) provided within or associated with leakage detection circuit 321. Because there is leakage current 103 in the selected SRAM cell 100 of column 300, this first test read operation is designated as leakage-susceptible.

The values DATA_REF and DATA_LK1 generated by sense amplifier 315 are compared to generate a first value of CPN_BLA and CPN_BLB that indicates whether the differential voltage between BL and $\overline{BL}$ generated during the first leakage-susceptible test read operation is detectable by sense amplifier 315. For example, if the differential voltage between BL and $\overline{BL}$ is sufficient to be detected by sense amplifier 315, then the value of DATA_LK1 matches the value of DATA_REF, and CPN_BL indicates that bit line current compensation is not desired. Conversely, if the differential voltage between BL and $\overline{BL}$ is not sufficient to be detected by sense amplifier 315, the value of DATA_LK1 will not match the value of DATA_REF, and CPN_BLA and CPN_BLB indicates that bit line current compensation is desired.

For embodiments in which the results of both the leakage-free sense operation and the leakage-susceptible test read operation are digital values, bit line compensation circuit 321 includes well-known digital comparators to compare the first and second values of DATA. For embodiments in which the results of both the leakage-free sense operation and the leakage-susceptible test read operation are analog values, bit line compensation circuit 321 includes well-known analog compare circuitry to compare the first and second values of DATA. For some, bit line compensation circuit 321 is a microprocessor programmed to perform the above-described functions.

If another leakage-susceptible test read operation is desired, leakage detection circuit 321 provides the current value of CPN_BLA and CPN_BLB to bit line compensation circuits 323A and 323B, which in response thereto selectively adjust the bit line current for the next test read operation. During the second leakage-susceptible test read operation, GT_EN remains asserted so that gating transistors 313A and 313B couple the bit lines BL and $\overline{BL}$ to sense amplifier 315, and signals CPC_A and CPC_B remain de-asserted so that calibration pre-charge circuits 322A and 322B isolate GBL and $\overline{GBL}$ from $V_{DD}$. Pre-charge signal PC is asserted to turn on pre-charge circuits 311A and 311B, which in turn pre-charge BL and $\overline{BL}$ high towards $V_{DD}$. In addition, the asserted states of CPN_BLA and CPN_BLB turn on bit line compensation circuits 323A and 323B to increase the bit line current for the second test read operation. The D=1 value stored in the selected SRAM cell 100 is read (e.g., by asserting the corresponding word line WL), thereby causing a differential voltage to appear between BL and $\overline{BL}$ (e.g., where BL remains in its logic high state and $\overline{BL}$ is discharged to logic low). The resulting differential voltage between BL and $\overline{BL}$ is measured by the sense amplifier 315 to generate the signal DATA indicative of the stored data value D=1. This data value is hereinafter referred to as the second leakage data value DATA_LK2 because it corresponds to the second leakage-susceptible test read operation. The value of DATA_LK2 is stored in a suitable memory element (not shown for simplicity) provided within or associated with leakage detection circuit 321. Because there is leakage current 103 in the selected SRAM cell 100 of column 300, this second test read operation is designated as leakage-susceptible.

The values DATA_REF and DATA_LK2 generated by sense amplifier 315 are compared to determine whether the differential voltage between BL and $\overline{BL}$ generated during the second leakage-susceptible test read operation is detectable by sense amplifier 315. If DATA_LK2 does not match DATA_REF, thereby indicating that the additional amount of bit line current provided by bit line compensation circuits 323A and 323B during the second test read operation was not sufficient to generate a differential voltage between BL and $\overline{BL}$ that can be detected by sense amplifier 315, another leakage-susceptible test read operation may be selectively performed in the manner described above. Conversely, if DATA_LK2 matches DATA_REF, thereby indicating that the additional amount of bit line current provided by bit line compensation circuit 323A and 323B during the second test read operation was sufficient to generate a differential voltage between BL and $\overline{BL}$ that can be read by sense amplifier 315, then the values of CPN_BLA and CPN_BLB are stored in a memory within or associated with leakage detection circuit 321, and the calibration mode is terminated.

Thereafter, to configure the memory device to operate in the normal mode, MD_SEL is driven to a second state. The second state of MD_SEL disables leakage detection circuit 321. The second state of MD_SEL also maintains the CPC signals in de-asserted states so that calibration pre-charge circuits 322A and 322B isolate GBL and $\overline{GBL}$, respectively, from $V_{DD}$, and maintains GT_EN in its de-asserted state so that gating transistors couple BL and $\overline{BL}$ to the sense amplifier 315. Referring also to FIG. 2A, for some embodiments, the second state of MD_SEL can be used to enable comparand register 210, priority encoder 206, and/or match logic 208 for compare operations in CAM device 200 during the normal operational mode. For read operations performed in the normal mode, the final values of CPN_BLA and CPN_BLB determined during the calibration mode are provided to bit line compensation circuits 323A and 323B, which in response thereto provide the corresponding amount of compensation current to BL and $\overline{BL}$, respectively. In this manner, the bit line compensation current provided by bit line compensation circuits 323A and 323B accurately compensates for leakage in SRAM cells 100, thereby improving the reliability of data read from column 300. In addition, because the amount of bit line compensation current is selected during the calibration mode, the read speeds are not adversely affected by the time associated with measuring the leakage effects.

As described above, the bit line compensation current provided by the bit line compensation circuits 323 is an adjustable current that is selectively determined by the leakage detection circuit 321 during the calibration mode. For some embodiments, the bit line compensation current is determined based on an iterative process of comparisons between the leakage-free sensed data and one or more leakage-susceptible test read data. The bit line control circuit 321 may be configured to increase the bit line compensation current incrementally during the iterative process until the leakage-susceptible read data matches the leakage-free reference data or until a maximum bit line current is reached.

For the exemplary embodiment FIG. 3A discussed above, a data value D=1 sensed during leakage-susceptible test read operations is compared with a modeled D=1 value between GBL/$\overline{GBL}$ sensed during the leakage-free sense operation. For other embodiments, a data D=0 can be programmed into the selected SRAM cell 100 and detected during leakage-susceptible test read operations for comparison with a modeled D=0 data value between GBL/$\overline{GBL}$ (e.g., by de-asserting CPC_A to logic low and asserting CPC_B to logic high so that calibration pre-charge circuit 322A maintains GBL in a logic low state and calibration pre-charge circuit 322B charges $\overline{GBL}$ to a logic high state). In addition, for the test read operations performed during the calibration mode, any suitable data can be programmed into the non-selected SRAM cells 100 to achieve varying levels and/or models of leakage in column 300.

Figure 3B:
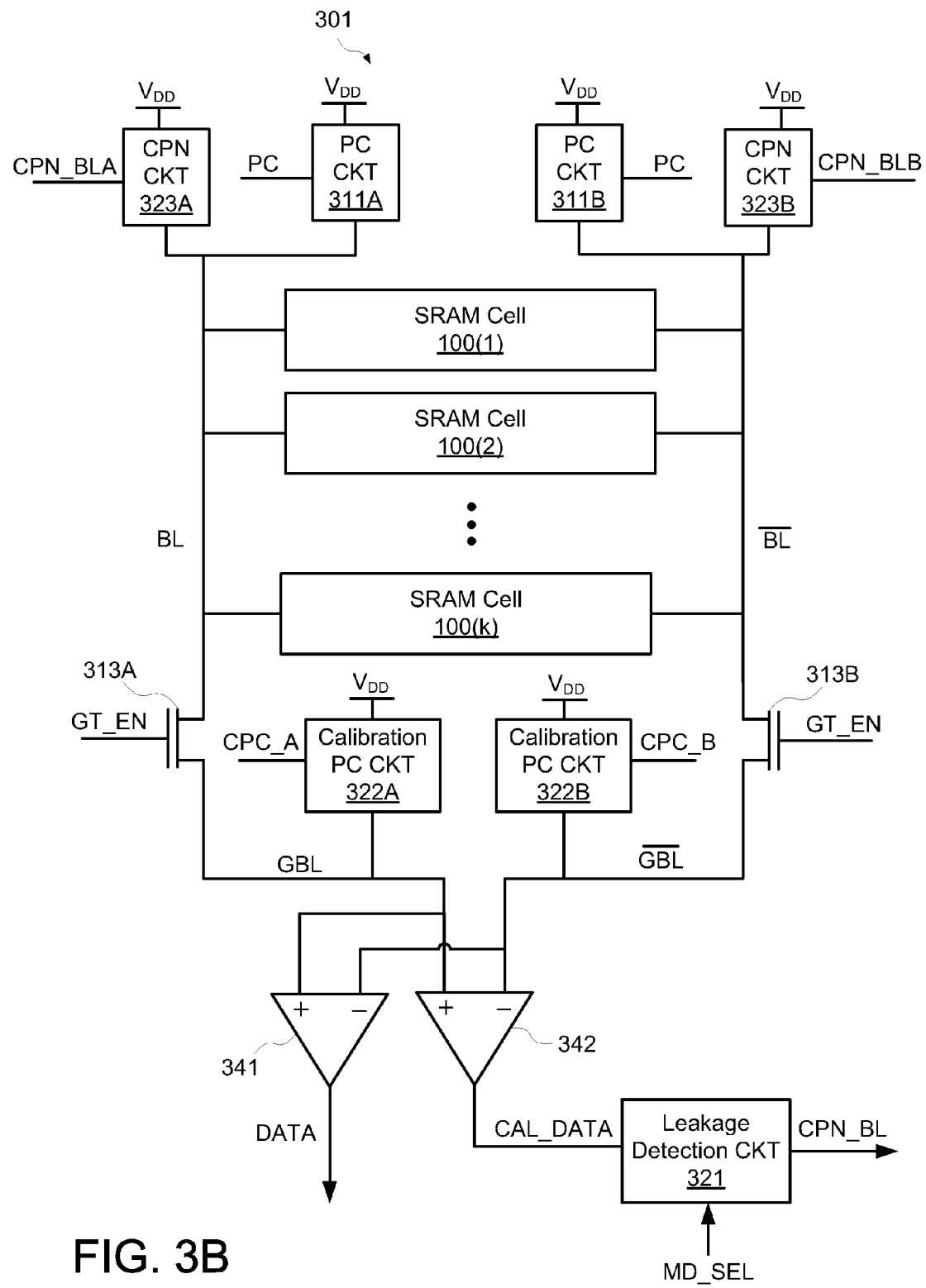
FIG. 3B shows a column of the CAM array of FIG. 2A in accordance with other embodiments.

FIG. 3B illustrates a column 301 of CAM array 202 in accordance with other embodiments. Column 301 is similar to column 300 of FIG. 3A, except that column 301 includes two sense amplifiers 341 and 342 instead of one sense amplifier 315. First sense amplifier 341 has inputs coupled to GBL and $\overline{GBL}$, and has an output to provide the sensed data DATA for read operations performed during the normal operational mode. Second sense amplifier 342 has inputs coupled to GBL and $\overline{GBL}$, and has an output to provide calibration data DATA_CAL for test read operations performed during the calibration mode. Sense amplifiers 341 and 342 can be any well-known sensing circuits that detect a differential voltage between GBL and $\overline{GBL}$ and generate a data signal indicative thereof.

In accordance with some embodiments, first sense amplifier 341 is active only during the normal operational mode and is optimized to achieve maximum reads speeds, and second sense amplifier 342 is active only during the calibration mode and is optimized for maximum sensitivity. For example, for some embodiments, second sense amplifier 342 is configured to resolve smaller differential voltages between BL and $\overline{BL}$ than first sense amplifier 341, whereas first sense amplifier 341 is configured to perform quick sense amplifications during the normal operational mode. In this manner, second sense amplifier 342 can be used to perform more accurate although typically slower data sensing operations (e.g., compared to first sense amplifier 341) during the calibration mode, and first sense amplifier 341 can be used to perform faster data sense operations (e.g., compared to second sense amplifier 341) during the normal operational mode.

Figure 4A:
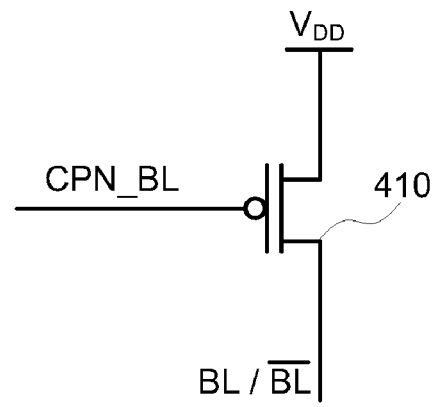
FIG. 4A shows one embodiment of the bit line compensation circuit of FIGS. 3A-3B.

FIG. 4A illustrates a bit line compensation circuit 410 that is one embodiment of the bit line compensation circuits 323A and 323B of FIGS. 3A and 3B. As shown in FIG. 4A, bit line compensation circuit 410 is a PMOS transistor coupled between $V_{DD}$ and one of the bit lines (BL or $\overline{BL}$) and having a gate to receive the bit line compensation signal CPN_BL. Transistor 410 selectively provides an additional amount of bit line current (e.g., in addition to pre-charge circuits 311) to compensate for leakage in response to CPN_BL. For some embodiments, CPN_BL is a digital signal (e.g., either logic high or logic low) that either turns on or turns off transistor 410. For other embodiments, CPN_BL is an analog signal whose voltage can be incrementally increased during successive test read operations to iteratively decrease the bit line current provided by transistor 410.

Figure 4B:
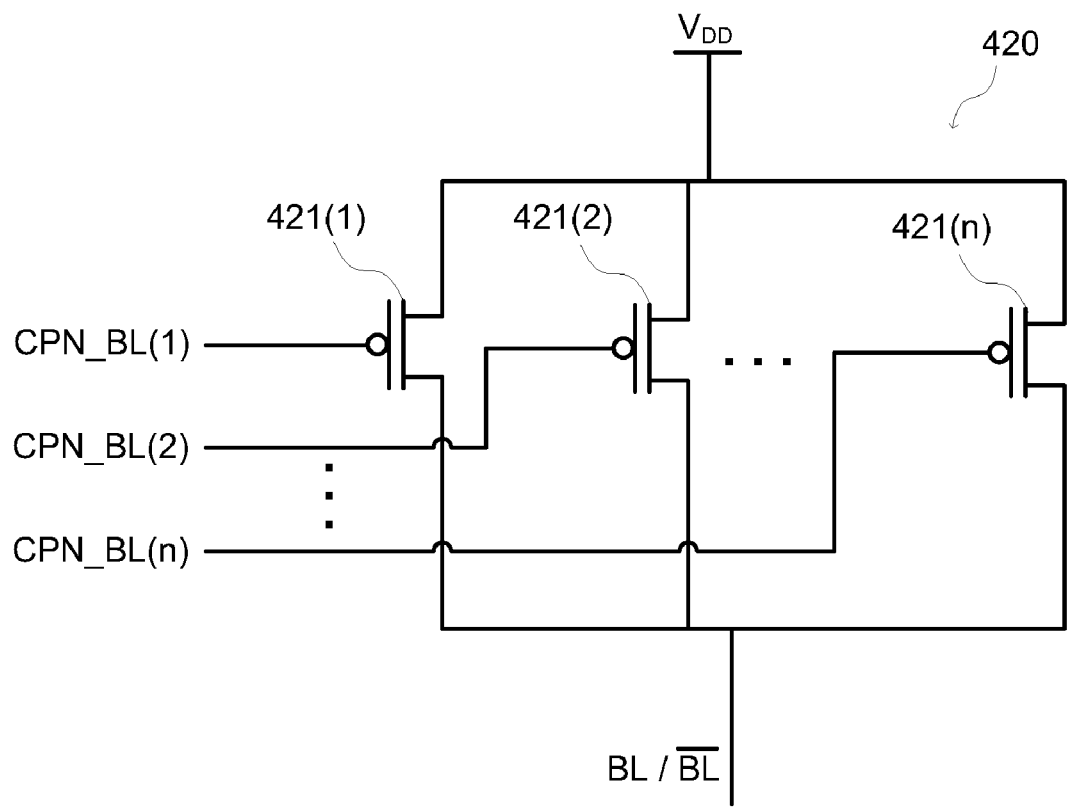
FIG. 4B shows another embodiment of the bit line compensation circuit of FIGS. 3A-3B.

FIG. 4B shows a bit line compensation circuit 420 that is another embodiment of the bit line compensation circuits 323A and 323B of FIGS. 3A and 3B. The bit line compensation circuit 420 includes a plurality of PMOS transistors 421(1)-421(n) connected in parallel between $V_{DD}$ and one of the bit lines (BL or $\overline{BL}$). Each of the PMOS transistors 421(1)-421(n) has a gate to receive a corresponding bit of the bit line compensation signal CPN_BL (as indicated in FIG. 4B), which controls the conductivity of the corresponding PMOS pull-up transistor 421. In accordance with present embodiments, the bit line current provided by circuit 420 can be selectively adjusted by dynamically selecting how many of the PMOS pull-up transistors 421(1)-421(n) are conductive. For example, asserting none of CPN_BL[n:1] turns on none of the PMOS pull-up transistors 421(1)-421(n), thereby providing no bit line compensation current. Asserting one of CPN_BL[n:1] turns on one of the PMOS pull-up transistors 421(1)-421(n) to provide a bit line compensation current, asserting two of CPN_BL[n:1] turns on two of the PMOS pull-up transistors 421(1)-421(n) to provide an increased bit line compensation current, and so on, where asserting all of CPN_BL[n:1] turns on all of the PMOS pull-up transistors 421(1)-421(n) to provide a maximum bit line compensation current.

For exemplary embodiments described herein, PMOS transistors 421(1)-421(n) are constructed to be of similar size and to have similar operating characteristics so that when conductive, each of transistors 421(1)-421(n) provides the same amount of compensation current to the associated bit line. For such embodiments, the bit line compensation current $I_{CPN}$ provided by the circuit 420 can be expressed as $I_{CPN}=I_D*N$, where N is the number of pull-up transistors 421 turned on, and $I_D$ is the current provided by one of the transistors 421. For other embodiments, PMOS pull-up transistors 421(1)-421(n) can be constructed to conduct varying amounts of current when turned on. For one such embodiment, transistors 421(1)-421(n) can be sized according to a binary scheme, where for example, transistor 421(x) provides twice the current as transistor 421(x−1), where x is an integer between 2 and n.

Figure 4C:
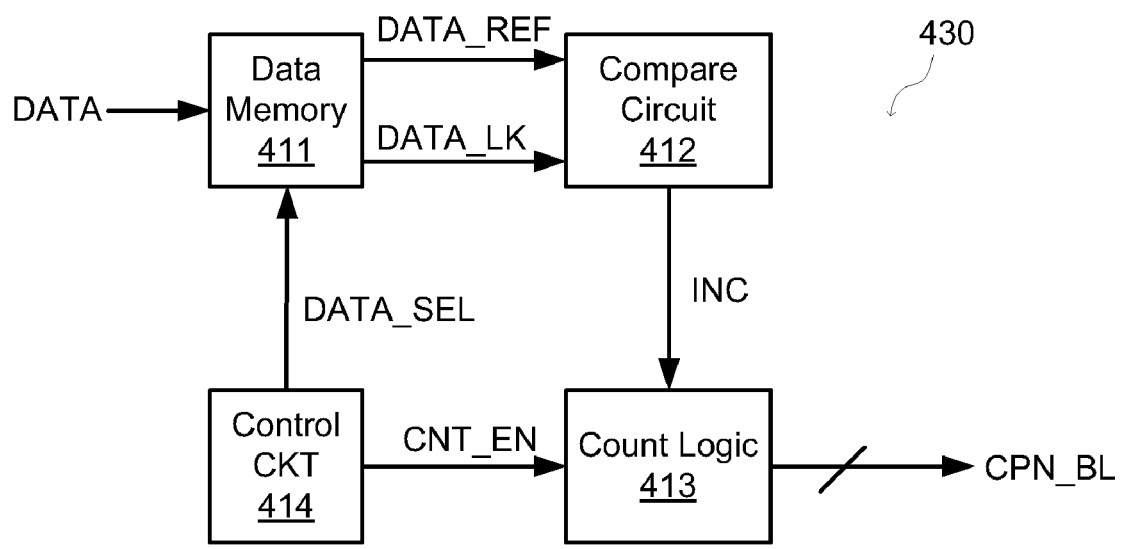
FIG. 4C shows one embodiment of the leakage detection circuit of FIGS. 3A-3B.

FIG. 4C shows a leakage detection circuit 430 that is one embodiment of leakage detection circuit 321 of FIGS. 3A and 3B. Leakage detection circuit 430, which includes a data memory 411, a compare circuit 412, count logic 413, and a control circuit 414, is configured to generate an n-bit signal CPN_BL that can be used to control the bit line compensation circuit 420 of FIG. 4B. Data memory 411, which can be any suitable memory element or device, has an input to receive the data signal from the output of sense amplifier 315 (see also FIG. 3A), and has outputs to provide DATA_REF and DATA_LK to compare circuit 412. Compare circuit 412, which is well-known, compares DATA_REF and DATA_LK to generate an increment signal INC. For exemplary embodiments described herein, compare circuit 412 asserts INC (e.g., to logic high) if DATA_LK≠DATA_REF and de-asserts INC (e.g., to logic low) if DATA_LK=DATA_REF.

Count logic 413, which has a first input to receive INC from compare circuit 412 and a second input to receive an enable signal CNT_EN from control circuit 414, selectively increments a count value in response to INC to generate the n-bit output signal CPN_BL. For exemplary embodiments described herein, count logic 413 increments the count value by one if INC is asserted, and maintains the current value of the count value if INC is de-asserted. For some embodiments, count logic 413 outputs the count value as a decoded value to generate CPN_BL. As described above, CPN_BL can be used to control the amount of compensation current provided to the bit lines of memory columns in array 202 by the bit line compensation circuits 323A and 323B. Control circuit 414 controls read and write operations of data memory 411 using a data select signal DATA_SEL, and controls the count logic 413 with the enable signal CNT_EN.

An exemplary operation of leakage detection circuit 420 is described below with reference to column 300 of FIG. 3A. After the first leakage-free and leakage susceptible test read operations are performed in column 300, the values DATA_REF and DATA_LK1 generated by sense amplifier 315 are stored in data memory 411. For some embodiments, DATA_REF and DATA_LK1 are stored in data memory 411 during a write operations controlled by control circuit 414 using DATA_SEL, which may include, for example, write enable signals and write addresses. Then, DATA_REF and DATA_LK1 are read from data memory 411 (e.g., during a read operation in response to DATA_SEL) and provided to compare circuit 412, which compares DATA_REF and DATA_LK1 to generate the result signal INC. If DATA_LK1=DATA_REF, the signal INC is de-asserted, no further bit line compensation current adjustments are desired, and the current value of CPN_BL is stored and thereafter provided to the bit line compensation circuits 323 during the normal operational mode. Conversely, if DATA_LK1≠DATA_REF, the signal INC is asserted, and additional bit line compensation current adjustments are desired. In response to the asserted state of INC, count logic 413 increments the count value and outputs its decoded value as CPN_BL.

A subsequent leakage susceptible test read operation is performed using the updated values of CPN_BLA and CPN_BLB, thereby generating a second sensed data value DATA_LK2, which is stored in data memory 411 and then compared with DATA_REF by compare circuit 412 to generate INC. If DATA_LK2=DATA_REF, the signal INC is de-asserted, no further bit line compensation current adjustments are desired, and the current values of CPN_BLA and CPN_BLB are stored and thereafter provided to the bit line compensation circuits 323 during the normal operational mode. Conversely, if DATA_LK2≠DATA_REF, the signal INC is asserted, and additional bit line compensation current adjustments are desired. Subsequent leakage-susceptible test read operations may then be performed in the manner described above.

Figure 5:
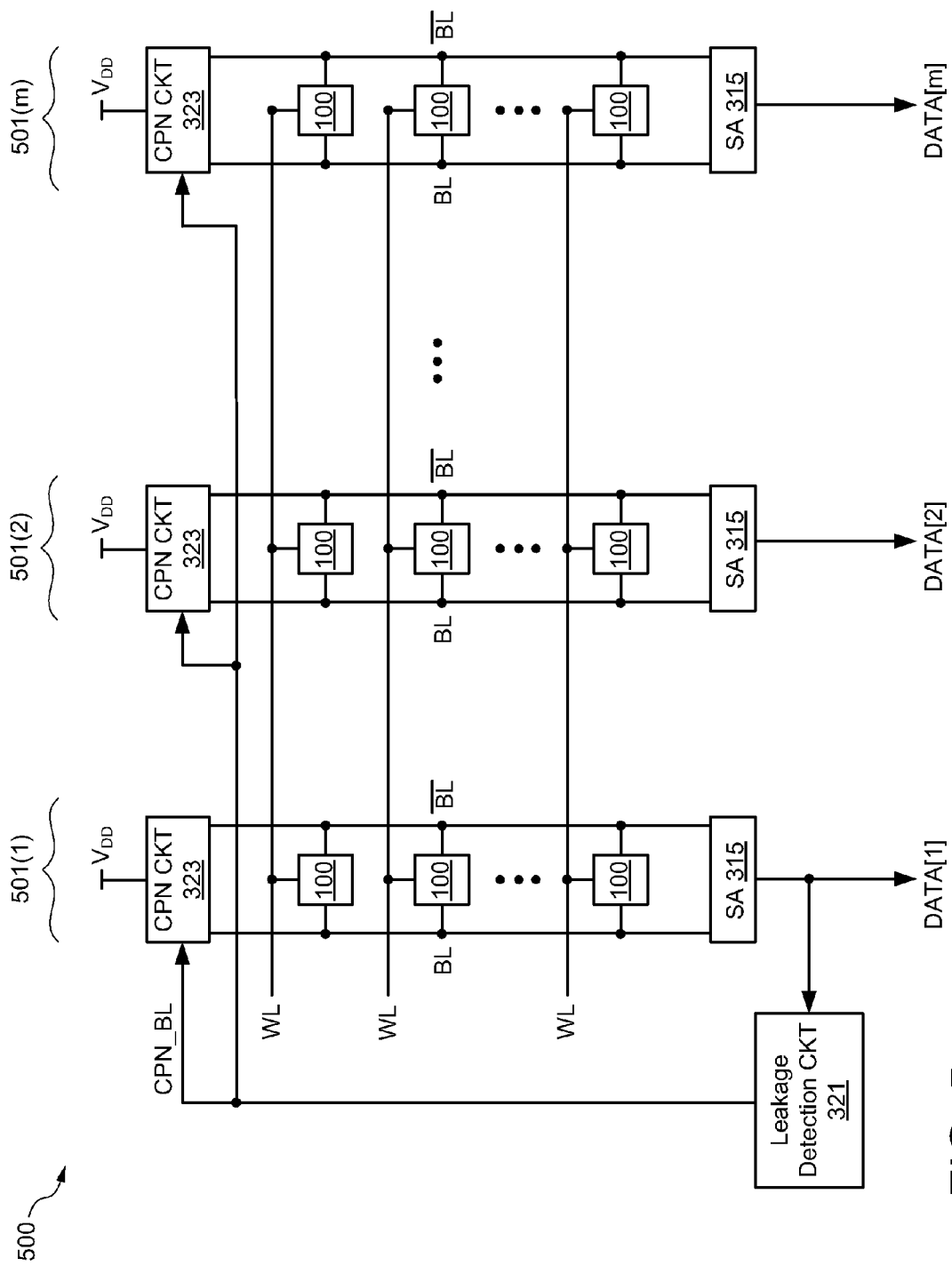
FIG. 5 shows an array of memory cells in accordance with other embodiments.

For the embodiments described above, each column of memory cells includes its own leakage detection circuit, which allows leakage to be addressed on a per-column basis. For other embodiments, multiple columns of memory cells can share the same leakage detection circuit. For example, FIG. 5 shows a memory block 500 in accordance with other embodiments. Memory block 500 is shown to include a plurality of columns 501(1)-501(m), each including a number of memory cells 100, a corresponding bit line compensation circuit 323, and a corresponding sense amplifier 315. The sense amplifier 315 in each of columns 501(1)-501(m) generates a corresponding bit of the data word DATA[m:1]. The data bit DATA[1] generated by the sense amplifier 315 in the first column 500(1) of memory cells 100 is provided to leakage detection circuit 321, which is shared by all columns 500(1)-500(m). Thus, the same bit line compensation signal CPN_BL generated by leakage detection circuit 321 is provided to the bit line compensation circuits 323 in all of the columns 500(1)-500(m). In this manner, leakage can be addressed on a per-block basis, thereby reducing the overhead of the leakage detection circuitry by allowing multiple columns 500(1)-500(m) to share the same leakage detection circuit 321. For other embodiments, the data signals output from the sense amplifiers 315 in all columns 501(1)-501(m) can be multiplexed to select one of the signals to be provided to leakage detection circuit 321, and the output CPN_BL of detection circuit 321 can be selectively applied to the corresponding compensation circuits 323.

Figure 6A:
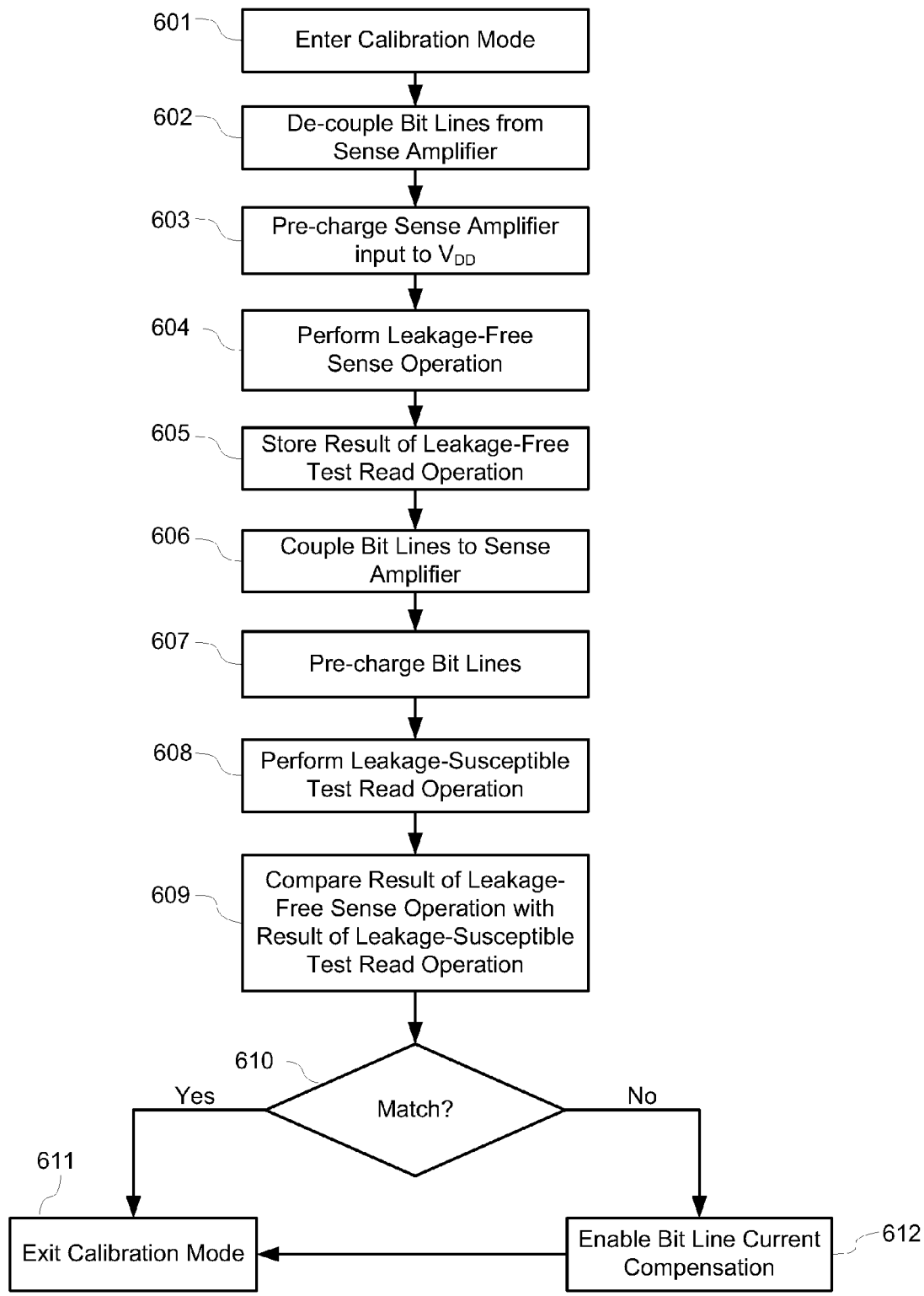
FIG. 6A is an exemplary flow chart illustrating a bit line leakage calibration process in accordance with some embodiments.

FIG. 6A is an exemplary flow chart illustrating operation of column 300 during the calibration mode for some embodiments, with reference to FIGS. 2A, 2B, and 3A. First, column 300 enters the calibration mode (601). As discussed above, the calibration mode may be entered by driving the mode select signal MD_SEL to the first state. For some embodiments, MD_SEL can be controlled by a user. For other embodiments, MD_SEL can be triggered periodically by a timer (not shown for simplicity) provided within the memory device. For still other embodiments, the memory device may be configured to enter the calibration mode when it is detected that the ambient temperature has changed by a pre-determined amount to automatically compensate for changes in leakage caused by temperature variations.

Once in the calibration mode, the bit lines (BL and $\overline{BL}$) are de-coupled from the sense amplifier 315 (602). For some embodiments, the bit lines are de-coupled from the sense amplifier by turning off the bit line gating transistors 313A and 313B. Then, one of the inputs of the sense amplifier is charged high toward $V_{DD}$ by the corresponding calibration pre-charge circuit 322 to develop a differential voltage between the sense amplifier inputs (e.g., to model a data bit stored in one SRAM cell 100) (603). Then, the leakage-free sense operation is performed to generate the reference data signal DATA_REF (604), and DATA_REF is stored in a suitable memory (e.g., within or associated with leakage detection circuit 321) (605).

Next, the bit lines (BL and $\overline{BL}$) are coupled to the sense amplifier 315, for example, by turning on the bit line gating transistors 313A and 313B (606). The bit lines are then pre-charged high towards $V_{DD}$ (607), and then the leakage-susceptible test read is performed to generate DATA_LK (608). Because the leakage-susceptible test read operation is performed with the bit lines coupled to the sense amplifier, bit line leakage currents affect the differential voltage developed between the complementary bit lines BL and $\overline{BL}$.

Then, the data sensed during the leakage-susceptible test read operation is compared with the data sensed during the leakage-free sense operation (609). If DATA_LK matches DATA_REF, as tested as 610, bit line current adjustments are not desired, and the memory device exits the calibration mode (611). Conversely, If DATA_LK does not match DATA_REF, as tested as 610, then bit line current compensation is enabled (612). For example, referring also to FIG. 4A, if bit line current adjustment is desired, CPN_BL is asserted to turn on bit line compensation transistor 410, which increases the bit line current provided during read operations.

Figure 6B:
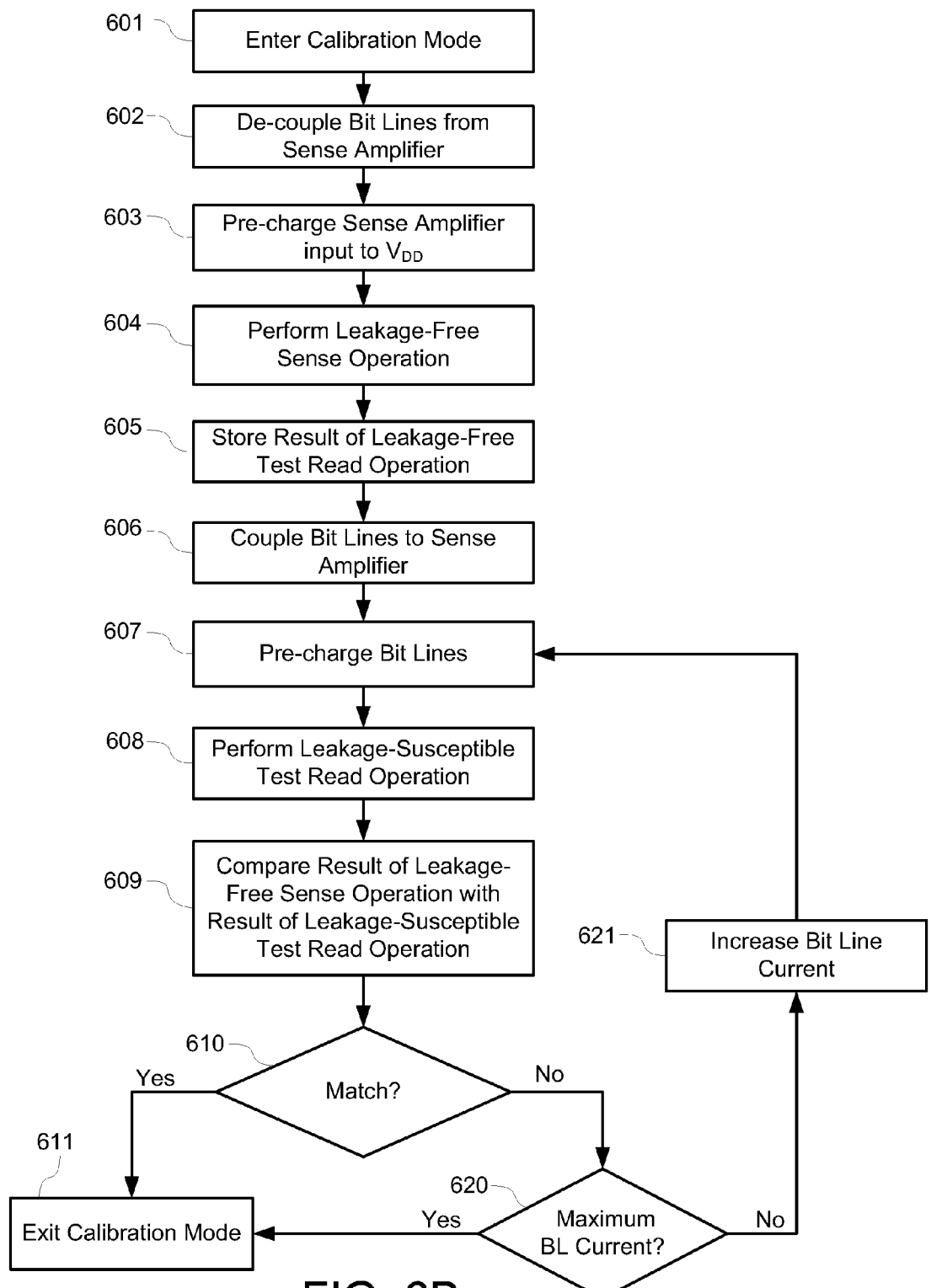
FIG. 6B is an exemplary flow chart illustrating a bit line leakage calibration process in accordance with other embodiments.

FIG. 6B is an exemplary flow chart illustrating operation of column 300 during the calibration mode for other embodiments, with reference to FIGS. 2A, 2B, and 3A. The exemplary embodiment of FIG. 6B is similar to that of FIG. 6A, except that the embodiment of FIG. 6B includes an iterative process by which the bit line current can be incrementally increased in response to successive leakage-susceptible test read operations.

Steps 601-611 of the flow chart of FIG. 6B are similar to those of FIG. 6A, and thus will not be repeated. If DATA_LK does not match DATA_REF at 610, it is determined if the maximum bit line current has been reached (620). If so, the calibration mode ends at 611. If not, the bit line current is incrementally increased (621). For example, referring also to FIG. 4B, if bit line current adjustment is desired, one of the bits of CPN_BL is asserted to turn on a corresponding one of the PMOS pull-up transistors 421, thereby increasing the bit line current provided for read operations. Then, processing continues at 607. In this manner, the bit line compensation current can be incrementally increased in successive test read operations until the total bit line current provided for read operations results in data being corrected sensed by the sense amplifier.

For some embodiments of FIG. 6B, the first leakage-susceptible test read operation is performed with none of the PMOS pull-up transistors 421 conductive, thereby starting the calibration mode with no bit line current compensation. For other embodiments, one or more of PMOS pull-up transistors 421 can be enabled at the beginning of the calibration mode, for example, by storing a predetermined value of CPN_BL. Further, for some embodiments, determining whether the maximum bit line compensation current is reached at 620 can be performed by detecting a maximum decoded value of CPN_BL (e.g., when CPN_BL has turned on all PMOS pull-up transistors 421(1)-421(n)).

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A content addressable memory (CAM) array having any number of columns, wherein at least one of the columns comprises:
   a plurality of CAM cells coupled to a bit line;
   a bit line compensation circuit coupled to the bit line and having an input to receive a compensation signal;
   a first sense amplifier having an input coupled to the bit line and having an output to generate a sensed data signal;
   a leakage detection circuit having an input coupled to the output of the first sense amplifier and having an output to generate the compensation signal; and
   a bit line gating transistor coupled between the bit line and the input of the first sense amplifier and having a gate to receive an enable signal, wherein the bit line gating transistor de-couples the bit line from the first sense amplifier during a calibration mode and couples the bit line to the first sense amplifier during read operations.

2. The CAM array of claim 1, wherein the compensation signal is generated in response to a comparison between the sensed data signal and a reference signal during the calibration mode.

3. The CAM array of claim 1, wherein the leakage detection circuit is disabled during read operations.

4. The CAM array of claim 1, wherein the bit line compensation circuit adjusts current flow to the bit line in response to the compensation signal.

5. The CAM array of claim 1, wherein the bit line compensation circuit comprises:
a plurality of PMOS pull-up transistors connected in parallel between the bit line and a supply voltage, each PMOS pull-up transistor having a gate coupled to receive a corresponding bit of the compensation signal.

6. The CAM array of claim 1, wherein the column further comprises:
a calibration pre-charge circuit coupled between the input of the first sense amplifier and a supply voltage and having a control input to receive a calibration pre-charge signal.

7. The CAM array of claim 6, wherein the calibration pre-charge circuit is enabled during the calibration mode, and is disabled during read operations.

8. The CAM array of claim 1, wherein the column further comprises:
a second sense amplifier having an input coupled to the bit line and having an output to generate the sensed data signal, wherein the first sense amplifier is configured to detect minimum variations in the sensed data and the second sense amplifier is configured to achieve maximum read speeds.

9. The CAM array of claim 8, wherein during the calibration mode the first sense amplifier is enabled and the second sense amplifier is disabled, and during an operational mode the first sense amplifier is disabled and the second sense amplifier is enabled.

10. A memory array having any number of columns, wherein at least one of the columns comprises:
a plurality of memory cells coupled to a bit line;
a bit line compensation circuit coupled to the bit line and having an input to receive a compensation signal;
a sense amplifier having an input coupled to the bit line and having an output to generate a sensed data signal;
a leakage detection circuit having an input coupled to the output of the sense amplifier and having an output to generate the compensation signal,
wherein the compensation signal is generated in response to a comparison between the sensed data signal and a reference signal during a calibration mode, and the leakage detection circuit is disabled during read operations.

11. The memory array of claim 10, wherein the column further comprises:
a bit line gating transistor coupled between the bit line and the input of the sense amplifier and having a gate to receive an enable signal.

12. The memory array of claim 11, wherein the bit line gating transistor de-couples the bit line from the first sense amplifier during the calibration mode and couples the bit line to the first sense amplifier during the read operations.

13. The memory array of claim 10, wherein the bit line compensation circuit comprises:
a plurality of PMOS pull-up transistors connected in parallel between the bit line and a supply voltage, each PMOS pull-up transistor having a gate coupled to receive a corresponding bit of the compensation enable signal.

14. The memory array of claim 10, wherein the column further comprises:
a calibration pre-charge circuit coupled between the input of the sense amplifier and a supply voltage and having a control input to receive a calibration pre-charge signal.

15. The memory array of claim 14, wherein the calibration pre-charge circuit is enabled during the calibration mode, and is disabled during read operations.

16. The memory array of claim 10, wherein the column further comprises:
a second sense amplifier having an input coupled to the bit line and having an output to generate the sensed data signal, wherein the first sense amplifier is configured to detect minimum variations in the sensed data and the second sense amplifier is configured to achieve maximum read speeds.

17. The memory array of claim 16, wherein during the calibration mode the first sense amplifier is enabled and the second sense amplifier is disabled, and during the read operations the first sense amplifier is disabled and the second sense amplifier is enabled.

18. A content addressable memory (CAM) device having a plurality of CAM arrays, each CAM array comprising:
a plurality of columns, each column including:
a plurality of CAM cells coupled to a bit line;
a bit line compensation circuit coupled to the bit line and having an input to receive a compensation signal; and
a sense amplifier having an input coupled to the bit line and having an output to generate a sensed data signal; and
one leakage detection circuit having an input coupled to the output of the sense amplifier in a first of the columns and having an output to generate the compensation signal, wherein the bit line compensation circuits in all the columns of the array are responsive to the compensation signal, wherein the compensation signal is generated in response to a comparison between the sensed data signal in the first column and a reference signal during a calibration mode, and wherein the leakage detection circuit is disabled during read operations.

19. The CAM device of claim 18, wherein the bit line compensation circuits adjust current flow in the bit lines in corresponding columns in response to the compensation signal.

20. The CAM device of claim 18, wherein each bit line compensation circuit comprises:
a plurality of PMOS pull-up transistors connected in parallel between the bit line in the corresponding column and a supply voltage, each PMOS pull-up transistor having a gate coupled to receive a corresponding bit of the compensation signal.

21. The CAM device of claim 18, wherein each column further comprises:
a bit line gating transistor coupled between the bit line and the input of the sense amplifier and having a gate to receive an enable signal.

22. The CAM device of claim 21, wherein the bit line gating transistor de-couple the bit line from the first sense amplifier during a calibration mode.

23. The CAM device of claim 18, wherein each column further comprises:
a calibration pre-charge circuit coupled between the input of the sense amplifier and a supply voltage and having a control input to receive a calibration pre-charge signal.

24. The CAM device of claim 18, wherein the calibration pre-charge circuit is enabled during a calibration mode, and is disabled during read operations.

* * * * *